(12) United States Patent  
Usami (10) Patent No.: US 8,169,089 B2  
(45) Date of Patent: May 1, 2012

(54) SEMICONDUCTOR DEVICE INCLUDING SEMICONDUCTOR CHIP AND SEALING MATERIAL

(75) Inventor: Toshihiko Usami, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 249 days.

(21) Appl. No.: 12/457,588

(22) Filed: Jun. 16, 2009

(65) Prior Publication Data

US 2009/0315192 A1 Dec. 24, 2009

(30) Foreign Application Priority Data

Jun. 24, 2008 (JP) ................................ 2008-164207

(51) Int. Cl.
- H01L 23/28 (2006.01)
- H01L 23/02 (2006.01)
- H01L 23/48 (2006.01)
- H01L 23/52 (2006.01)
- H01L 29/40 (2006.01)
- H01L 23/29 (2006.01)

(52) U.S. Cl. ........ 257/787; 257/678; 257/690; 257/784; 257/790; 257/E23.024; 257/E23.033; 257/E23.124

(58) Field of Classification Search ............ 257/678, 257/784, 787, E23.024, E23.033, E23.124, 257/690, 790

See application file for complete search history.

(56) References Cited

U.S. PATENT DOCUMENTS

| | | | |
|---|---|---|---|
| 3,784,883 A * | 1/1974 | Duncan et al. | 257/664 |
| 6,291,898 B1 * | 9/2001 | Yeh et al. | 257/786 |
| 6,294,411 B1 | 9/2001 | Nishibayashi | |
| 6,307,272 B1 * | 10/2001 | Takahashi et al. | 257/787 |
| 6,396,143 B1 * | 5/2002 | Kimbara et al. | 257/712 |
| 6,476,481 B2 * | 11/2002 | Woodworth et al. | 257/696 |
| 6,479,327 B2 * | 11/2002 | Takahashi et al. | 438/124 |
| 7,064,420 B2 * | 6/2006 | Han et al. | 257/669 |
| 7,396,763 B2 * | 7/2008 | Hong | 438/652 |
| 7,407,312 B2 * | 8/2008 | Lee | 362/555 |
| 7,420,809 B2 * | 9/2008 | Lim et al. | 361/707 |
| 7,482,203 B2 * | 1/2009 | Song et al. | 438/109 |
| 7,566,590 B2 * | 7/2009 | Zhong et al. | 438/119 |
| 7,573,119 B2 * | 8/2009 | Kobayashi et al. | 257/531 |
| 7,741,154 B2 * | 6/2010 | Ha et al. | 438/109 |
| 7,796,188 B2 * | 9/2010 | Wu | 348/374 |
| 7,808,093 B2 * | 10/2010 | Kagaya et al. | 257/686 |
| 7,898,813 B2 * | 3/2011 | Nishiyama et al. | 361/737 |
| 7,999,276 B2 * | 8/2011 | Yoon | 257/98 |
| 2003/0179549 A1 * | 9/2003 | Zhong et al. | 361/707 |
| 2005/0269676 A1 * | 12/2005 | Lee et al. | 257/678 |
| 2006/0012056 A1 | 1/2006 | Ueno et al. | |
| 2007/0018296 A1 * | 1/2007 | Kwon et al. | 257/678 |
| 2007/0096129 A1 * | 5/2007 | Park | 257/98 |
| 2007/0187823 A1 * | 8/2007 | Tanaka et al. | 257/737 |

(Continued)

FOREIGN PATENT DOCUMENTS

JP 05-299530 11/1993

(Continued)

*Primary Examiner* — Ida M Soward (74) *Attorney, Agent, or Firm* — Foley & Lardner LLP (57) ABSTRACT

A semiconductor device includes at least bonding wires between electrode pads on a main surface of a semiconductor chip and connection pads on a wiring board. The wires form loop shapes from the electrode pads of the semiconductor chip. The semiconductor device also includes at least forming flat parts on the loop-shaped wires, and using a sealing material to seal the semiconductor chip such as to bury the flat parts.

18 Claims, 7 Drawing Sheets

U.S. PATENT DOCUMENTS

| | | | |
|---|---|---|---|
| 2008/0023721 A1* | 1/2008 | Lee et al. | 257/99 |
| 2008/0054431 A1* | 3/2008 | Wang et al. | 257/686 |
| 2008/0073786 A1* | 3/2008 | Tanabe et al. | 257/741 |
| 2009/0039986 A1* | 2/2009 | Kamgaing et al. | 333/24 |
| 2009/0091042 A1* | 4/2009 | Do et al. | 257/777 |
| 2009/0134504 A1* | 5/2009 | Lee et al. | 257/680 |
| 2009/0243099 A1* | 10/2009 | Fan et al. | 257/738 |

FOREIGN PATENT DOCUMENTS

| | | |
|---|---|---|
| JP | 06-334109 | 12/1994 |
| JP | 10-189631 | 7/1998 |
| JP | 2001-284378 A | 10/2001 |
| JP | 2002-299357 A | 10/2002 |
| JP | 2006-032471 A | 2/2006 |

* cited by examiner

SEMICONDUCTOR DEVICE INCLUDING SEMICONDUCTOR CHIP AND SEALING MATERIAL

BACKGROUND OF THE INVENTION

1. Field of the Invention

The present invention relates to a method of manufacturing a semiconductor device.

Priority is claimed on Japanese Patent Application No. 2008-164207, filed Jun. 24, 2008, the content of which is incorporated herein by reference.

2. Description of Related Art

Figure 14:
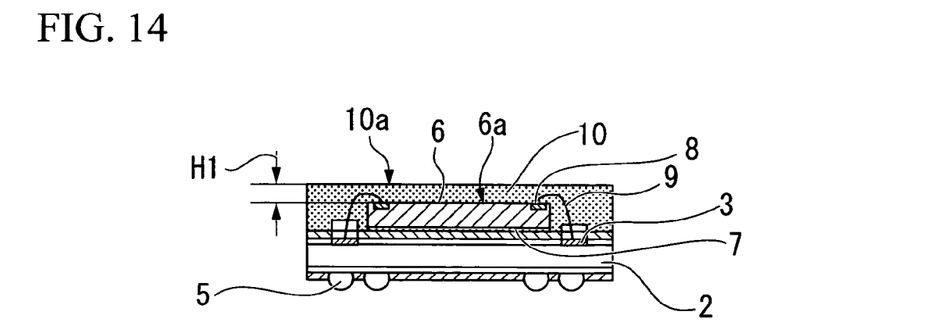
FIG. 14 is schematic cross-sectional view of a BGA semiconductor device using a related wire-bonding method.

FIG. 14 is the configuration of a related BGA semiconductor device using wire bonding method. In FIG. 14, a semiconductor device 101 includes at least a roughly quadrangular wiring board 2. On one face of the wiring board 2, a plurality of connection pads 3 are fabricated, and a semiconductor chip 6 is secured through, for example, a die-attach film (DAF) 7 that becomes an insulating adhesive. A plurality of electrode pads 8 are formed near the periphery of a top face 6a of the semiconductor chip 6, and are electrically connected to corresponding connection pads 3 of the wiring board 2 by joining them using conductive wires 9 made from, for example, Au or Cu. The one face of the wiring board 2 is then covered with a sealant 10 made from a thermosetting resin such as, for example, epoxy resin, such as to cover the semiconductor chip 6 and the wires 9. Also, solder balls 5 are provided on another face of the wiring board 2 that is on an opposite side to the one face. The solder balls 5 and the connection pads 3 are connected by wiring (not shown) inside the wiring board 2.

Following advancements in electronic devices such as mobile telephones and digital cameras, there are strong demands for smaller and thinner semiconductor devices for mounting, requiring various methods for making them smaller and thinner. As one thinning method, it is important to reduce the thickness of the sealing resin that covers a package top part of a chip and wires for mounting (section H1 in FIG. 14, the thickness from a top face 6a of the semiconductor chip to a top face 10a of the sealant 10). For design purposes, however, if the thickness H1 is made too thin, there is a possibility that variation in the height of the sealing resin and wire bonding caused during mass production will result in exposure of the wires 9, increasing the number of defective products and shortening product lifespan. Therefore, the thickness H1 of the top-part sealing resin (e.g. H1=approximately 0.20 mm) cannot be designed any thinner than a fixed value.

Japanese Unexamined Patent Application, First Publication, No. 1998-189631 discloses one manufacturing method that enables the package top part to be made thinner, wherein one part of a die (movable-part die) is lowered onto the top parts of bonding wires to restrict the wire heights, and in that state a primary resin seal is applied; a secondary resin seal is applied after raising the movable-part die again. In this invention, since only part of the die is lowered and raised again, positional deviation arising when the movable-part die is raised again leave scratches on the package surface, conceivably resulting in external defects and restrictions on marking positions. Also, the movable-part die must be designed and manufactured for each product shape, increasing the cost and the time taken to set the die, etc. Such demerits lead to increased manufacturing cost and manufacturing time, rendering this invention inadequate as a method of thinning.

Further, in a method disclosed in Japanese Unexamined Patent Application, First Publication, No. 2002-299357, after pressing a die against the tip parts of bonding wires and sealing with resin, an insulating coating film (e.g. a film) is pasted over a top-part surface. Conceivable demerits of this method, due to the use a coating film, are reduced reliability (resistance to peeling, moisture, etc.) and the coating film-pasting time (increased operation time), etc.

SUMMARY

In one embodiment, there is provided a method of manufacturing a semiconductor device that includes at least: bonding wires such as to form loop shapes from electrode pads of a semiconductor chip between the electrode pads-on a main surface of the semiconductor chip and connection pads on a wiring board; forming flat parts on the loop-shaped wires; and sealing the semiconductor chip such as to bury the flat parts by a sealing material.

In another embodiment, in the method of manufacturing a semiconductor device, the bonding may comprise bonding wires such as to form upward loop shapes from electrode pads of a semiconductor chip.

In still another embodiment, there is provided a semiconductor device that includes at least: a wiring board; a semiconductor chip that is disposed on one face side of the wiring board; and wires that form loop shapes from electrode pads of the semiconductor chip between the electrode pads on a main surface of the semiconductor chip and connection pads on the wiring board, wherein the wires comprise flat parts that are buried by a sealing material.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

[First Embodiment]

A semiconductor device and a manufacturing method thereof according to a first embodiment of the invention will be explained with reference to the drawings.

Figure 1:
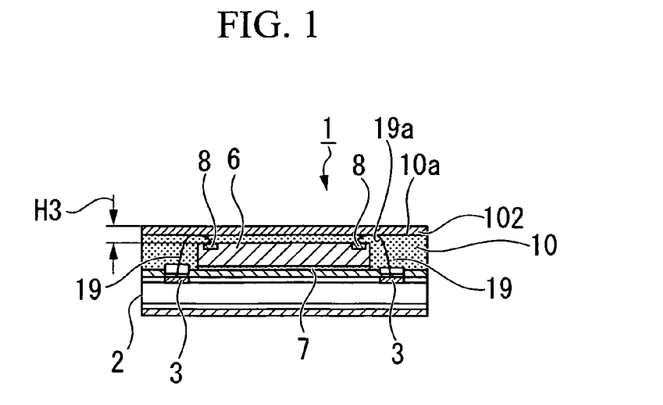
FIG. 1 is a schematic cross-sectional view of a BGA semiconductor device using wire-bonding method according to a first embodiment of the invention.

As shown in FIG. 1, a semiconductor device 1 according to this embodiment includes at least a roughly quadrangular wiring board 2. The wiring board 2 is, for example, a glass epoxy substrate with predetermined wiring formed in it.

On one face of the wiring board 2, a plurality of connection pads 3 are fabricated. Also, on the one face of the wiring board 2, a semiconductor chip 6 is secured through, for example, a die-attach film (DAF) 7 that becomes an insulating adhesive. For example, a logical circuit, a storage circuit, and such like are fabricated on one face of the semiconductor chip 6. A plurality of electrode pads 8 are formed near the periphery of a top face (main surface) 6a of the semiconductor chip 6.

The electrode pads 8 of the semiconductor chip 6 are electrically connected to corresponding connection pads 3 of the wiring board 2 by joining them using conductive wires 19. The wires 19 are made from, for example, Au or Cu. The one face of the wiring board 2 is covered with a primary sealant 10 such as to cover the semiconductor chip 6 and the wires 19. The primary sealant 10 is made from a thermosetting resin such as, for example, epoxy resin.

A secondary sealant 102 is then laminated onto a top face 10a of the primary sealant 10. The secondary sealant 102 is made from a thermosetting resin such as epoxy resin, similar to the primary sealant 10.

Each wire 19 is formed in a loop-shape, and a flat part 19a is provided at its tip part. The flat part 19a is a portion that has been flattened by using a flat jig or the like to crush one part of the loop-shaped wire. The flat part 19a is-provided at the interface (top face 10a of the primary sealant 10) between the primary sealant 10 and the secondary sealant 102.

A method of manufacturing the semiconductor device of this embodiment includes at least the following steps.

Figure 2:
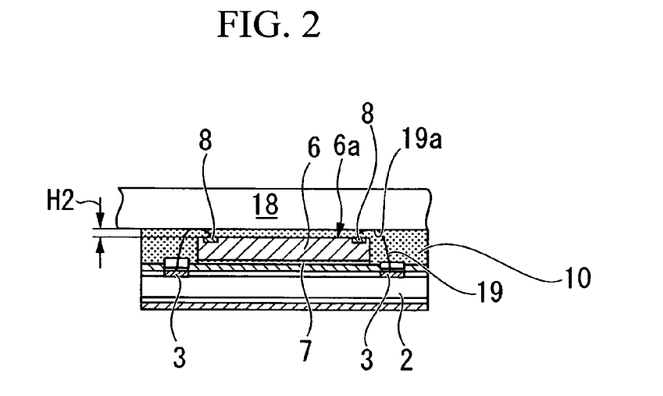
FIG. 2 is a schematic view of a primary sealing step of a BGA semiconductor device using wire-bonding method according to a first embodiment of the invention.
Figure 3:
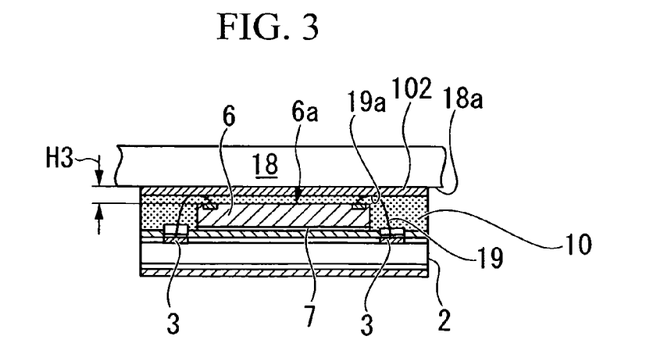
FIG. 3 is a schematic view of a secondary sealing step of a BGA semiconductor device using wire-bonding method according to a first embodiment of the invention.

As shown in FIGS. 2 and 3, electrode pads 8 on the main surface 6a of the semiconductor chip 6 and the connection pads 3 of the wiring board 2 are bonded together by the wires 19. The wires 19 are formed in a loop-shape extending upwards from the electrode pads 8 of the semiconductor chip 6. The extending upwards is a mere example, the wires 19 may extend downwards, side wards, etc. The flat parts 19a are formed at the tip parts of the wires 19. The semiconductor chip 6 is then sealed with sealing material (primary sealant 10 and secondary sealant 102) so as to bury the flat parts 19a.

FIGS. 2 and 3 will be explained in detail.

In this embodiment, the semiconductor chip 6 is mounted on the wiring board 2 with the DAF 7 in between, and the electrode pads 8 of the semiconductor chip 6 are bonded to the connection pads 3 of the wiring board 2 by the wires 19. The wires 19 are formed in an upward loop-shape. This forms the tip parts of the wires 19. Subsequently, as a sealing step first stage (flat part-forming step and sealing step), as shown in FIG. 2, a top-part sealing die 18 (movable member) is set such that an abutting face 18a thereof touches the tip parts of the bonding wires 19, i.e. it is set at a position of an approximate thickness H2 from the top face 6a (main surface) of the semiconductor chip 6 (e.g. H2=0.08 mm); in that state, primary sealing is performed using the primary sealant 10. Instead of the partially moving die mentioned in Japanese Unexamined Patent Application, First Publication, No. 1998-189631, the top-part sealing die 18 can be the whole of a flat plate-like die. The object of the first stage is to form the flat parts 19a on the wires 19 by making the top-part sealing die 18 touch the tip parts of the wires 19, collectively flatten the height of the loops, and perform sealing in this state while suppressing variation. In this stage, it is possible that the flat parts 19a of the wires 19 may still be exposed.

In a sealing step second stage (sealing step), as shown in FIG. 3, the top-part sealing die 18 is set at a position that is slightly raised above the first stage by approximately an interval H3 between the top-part sealing resin and the top end of the semiconductor chip 6 (e.g. H3=0.15 mm), lifting the top-part sealing die 18 above the flat parts 19a and forming a space between the abutting faces 18a and the flat parts 19a. To completely seal the exposed parts of the wires 19, the space thus formed is filled with sealing resin, and the secondary sealant 102 is used to make a thin secondary seal. The reason why this secondary seal can be made thin is that, since variation in the loop heights of the wires 19 is suppressed due to execution of the first stage, the design margin value relating to variation can be reduced. In this embodiment, the thickness of the top-part sealing resin that forms the secondary sealant 102 can be made approximately H3=0.15 mm thinner than a general design example (H1=0.20 mm).

Figure 4:
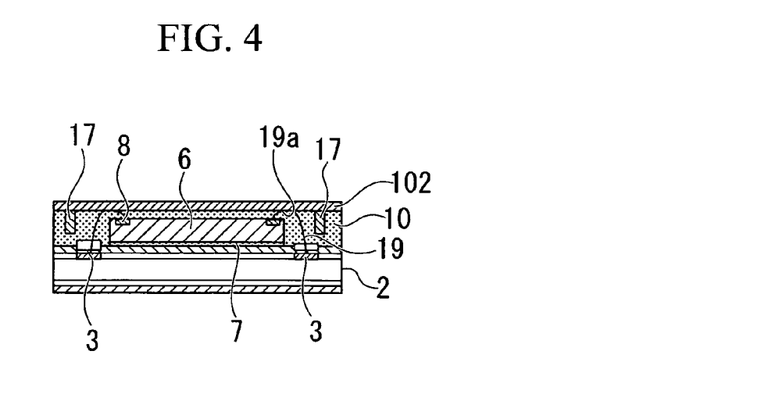
FIG. 4 is a schematic view of a configuration that enhances adhesion of a sealant in a secondary sealing step of a BGA semiconductor device using wire-bonding method according to a first embodiment of the invention.

FIG. 4 is a structure for enhancing the adhesion between the primary sealant 10 and the secondary sealant 102, which is a concern during secondary sealing. In FIG. 4, adhesion is enhanced by providing indentations 17 in the primary sealant 10 on both sides of the semiconductor chip 6, and filling these indentations 17 with the secondary sealant 102.

[Second Embodiment]

Figure 5:
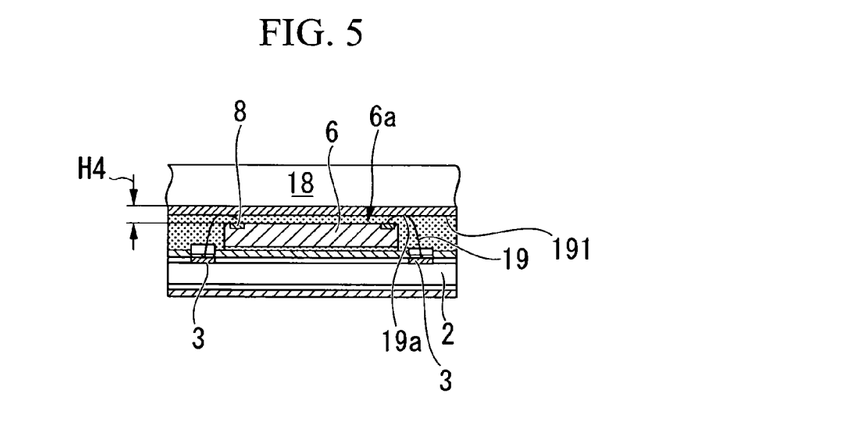
FIG. 5 is a schematic view of a sealing step of a BGA semiconductor device using wire-bonding method according to a second embodiment of the invention.
Figure 6:
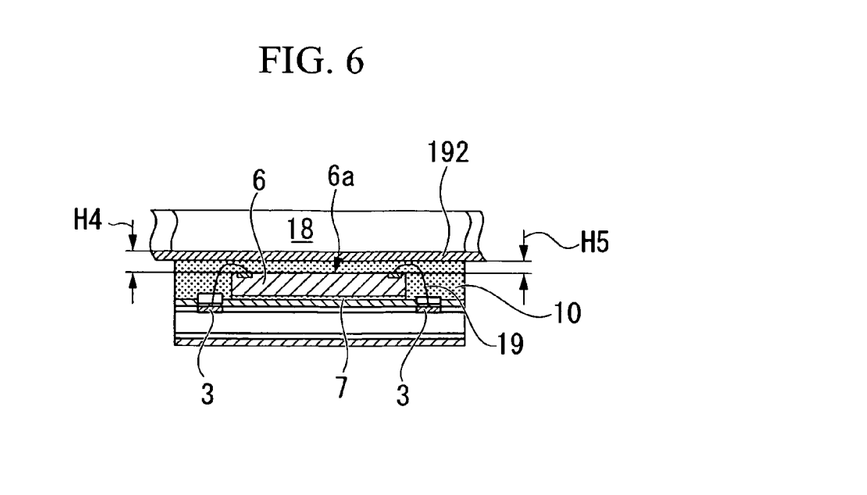
FIG. 6 is a schematic view of a sealed state of a BGA semiconductor device using wire-bonding method according to a second embodiment of the invention.

FIGS. 5 and 6 are cross-sectional views of a sealing step in a method of manufacturing a semiconductor device according to a second embodiment.

In this embodiment, as in the sealing step first stage (flat part-forming step and sealing step), as in FIG. 5, a first releasing film 191 (abutting member) having a thickness of, for example, approximately 0.10 mm is attached to the top-part sealing die 18, and the top-part sealing die 18 is lowered one time to a position where the first releasing film 191 touches the tip parts of the bonding wires 19, for example, approximately at the position (first position) of interval H4 (e.g. H4=0.18 mm) from the main surface 6a of the semiconductor chip 6 to the top-part sealing die 18. The aim of the first stage is to collectively flatten the wires 19 by pressing the first releasing film 191 and the top loop portions of the wires 19 against each other, deforming the tip parts of the loops of the wires 19 to the flat parts 19a and thereby eliminating variation in their heights. After this collective flattening, the top-part sealing die 18 and the first releasing film 191 are returned to their original positions (second position) without applying the sealing resin.

Subsequently, as shown in FIG. 6, the first releasing film 191 attached to the top-part sealing die 18 is replaced with a second releasing film 192 (seal-forming member) that is thinner than the first releasing film 191, e.g. having a thickness of approximately 0.05 mm. The top-part sealing die 18 is then pressed down and reset at the same position as in the first stage (first position, e.g. H4=0.18 mm), and sealing resin is filled into the space formed between the second releasing film 192 and the flat parts 19a to achieve sealing using the primary sealant 10.

In this method, by executing the first stage, the design margin value relating to variation can be reduced by suppressing variation in the loop height of the wires 19, and top-part sealing can be performed while keeping the difference in the thicknesses of the first releasing film 191 and the second releasing film 192 at a low value of approximately 0.05 mm, and without exposing the wires 19. In this embodiment, the thickness of the top-part sealing resin using the primary sealant 10 can be reduced to approximately H5=0.13 mm, which is thinner than a general design example (H1=0.20 mm). When redesigning the thickness of the package top-part resin for mass production, all that is required is selection of and substitution with a releasing film having a corresponding thickness, making mass-production easier. Further, in comparison with the first embodiment, preparation of the top-part die, the setting operation, and the sealing operation need only be performed once, making this an effective process in regard to manufacturing cost and work time.

Figure 7:
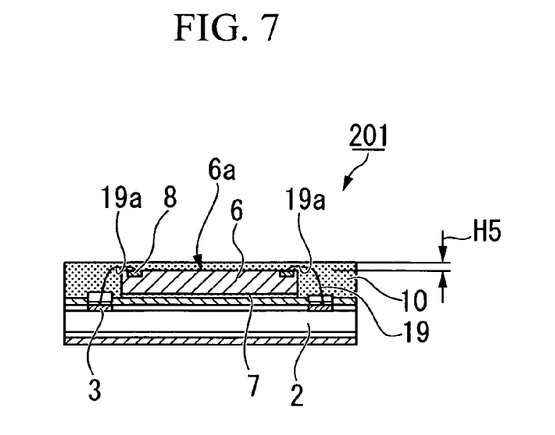
FIG. 7 is a schematic cross-sectional view of a BGA semiconductor device using wire-bonding method according to a second embodiment of the invention.

FIG. 7 is a semiconductor device 201 manufactured according to this embodiment. As shown in FIG. 7, the semiconductor device 201 according to this embodiment includes at least a roughly quadrangular wiring board 2. A predetermined wiring is formed in the wiring board 2. A plurality of connection pads 3 are formed on one face of the wiring board 2. Furthermore, a semiconductor chip 6 is secured to this one face of the wiring board 2 through, for example, a die-attach film (DAF) 7 that becomes an insulating adhesive. A plurality of electrode pads 8 are formed near the periphery of a main surface 6a of the semiconductor chip 6.

The electrode pads 8 of the semiconductor chip 6 are electrically connected to corresponding connection pads 3 of the wiring board 2 by joining them using conductive wires 19. The wires 19 are made from, for example, Au or Cu. The one face of the wiring board 2 is then covered with a primary sealant 10 such as to cover the semiconductor chip 6 and the wires 19. The primary sealant 10 is made from a thermosetting resin such as, for example, epoxy resin.

Each wire 19 is formed in a loop-shape, and a flat part 19a is provided at its tip part. The flat part 19a is a portion that has been flattened by using a top-part sealing die 18 to crush one part of the loop-shaped wire. The flat part 19a is enclosed inside the primary sealant 10.

According to the semiconductor device 210 and a manufacturing method thereof of this embodiment, variation in the heights of the wires 19 can be eliminated, thereby suppressing increase in the number of defective products and deterioration in product lifespan, and a thin package can be realized, enabling the package to be designed with a minimum resin thickness.

[Third Embodiment]

Figure 8:
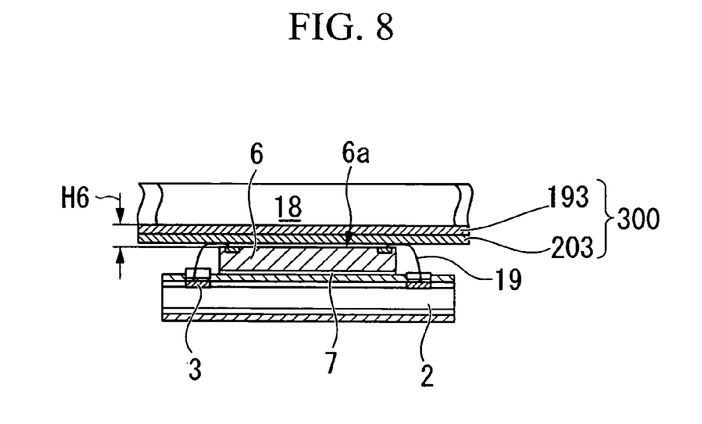
FIG. 8 is a schematic view of a sealing step of a BGA semiconductor device using wire-bonding method according to a third embodiment of the invention.
Figure 9:
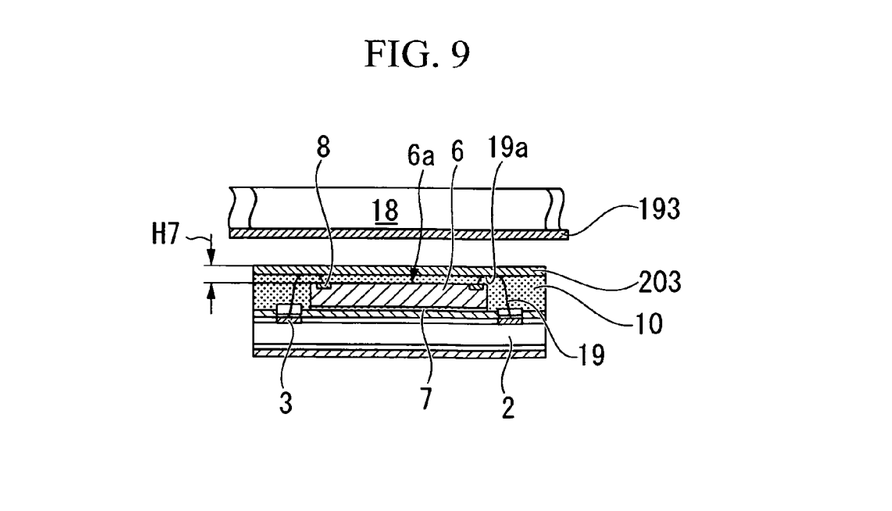
FIG. 9 is a schematic view of a sealed state of a BGA semiconductor device using wire-bonding method according to a first embodiment of the invention.

FIGS. 8 and 9 are cross-sectional views of sealing steps in a method of manufacturing a semiconductor device in a third embodiment.

In this embodiment, in a flat part-forming step and a sealing step, as shown in FIG. 8, a two-layer film 300 is provided to the top-part sealing die 18, the top-part sealing die 18 is lowered to a position where it touches the top faces of the wires 19, i.e. approximately to a distance H6 from the main flat face 6a of the semiconductor chip 6 to the top-part sealing die 18 (e.g. H6=0.18 mm), and sealing is performing using the primary sealant 10 with variation in the heights of the loops being eliminated by forming of the flat parts 19a in the wires 19. The top side of the two-layer film 300 is a releasing film 193 (releasing member), and its bottom side is a thin insulating film 203 (abutting member) of, for example, an epoxy resin-type material that resembles the material constituting the primary sealant 10; its thickness is approximately 0.02 mm. A weak adhesive can be applied between the layers of the two-layer film 300, or films can be set in a two-layer state without affixing them together.

After sealing, as shown in FIG. 9, the top-part sealing die 18 and the releasing film 193 on the top side of the two-layer film 300 are raised so that they are peeled off from the insulating film 203. Thus the insulating film 203 is pasted for protection over the top face of the semiconductor device. The flat parts 19a of the wires 19 are now at the interface (top face 10a of the primary sealant 10) between the primary sealant 10 and the insulating film 203.

In this method, variation in the heights of the wires 19 is greatly suppressed by lowering the top-part sealing die 18 and the two-layer film 300 until they touch the wires 19, and in addition, the thin insulating film 203 can protect the flat parts 19a of the wires 19. Therefore, in comparison with a general design example (H1=0.20 mm), the thickness of the top-part sealing resin can be reduced to a total thickness, including the top-part sealing resin made from the primary sealant 10 and the insulating film 203, of approximately H7=0.10 mm. Further, by sealing with resin at the same time as pasting the insulating film 203 (abutting member) to the primary sealant 10, using the insulating film 203 made from a material resembling the primary sealant 10, heat and pressure generated during the sealing operation using the primary sealant 10 increase the adhesion and bonding between the primary sealant 10 and the insulating film 203. As a result, problems of film-peeling reduce. Moreover, since the operations of pasting the two-layer film and peeling the films are performed at the same time as the sealing operation during which the top and bottom dies are moving, the process has few additional operations accompanying film-pasting as in Japanese Unexamined Patent Application, First Publication, No. 2002-299357.

Incidentally, in a semiconductor device using wire-bonding method, if variation is suppressed by making the top-faces of the wire loops touch the sealing die and a thin seal is achieved, this configuration is not limited to a sealing die that touches the wires, and can also be applied in releasing films and insulating films, and, for example, on the rear face of a semiconductor device and a chip, etc.

FIRST EXAMPLE

Using FIGS. 10A to 10G, a method of manufacturing the semiconductor device in the first example will be explained. The first example corresponds to the method of manufacturing the semiconductor device of the first embodiment.

The wiring motherboard used in manufacturing the semiconductor device of this example is a substrate formed from, for example, a glass epoxy base material, and includes at least a plurality of product-formation regions.

The product-formation regions are arranged in a matrix, with dicing lines formed around each of them. By cutting long the dicing-lines, the product-formation regions become positions of wiring boards 2 for a semiconductor device.

The product-formation regions have the same structure as the wiring boards 2 for semiconductor device, including a plurality of connection pads 3 formed on one face around an area where a semiconductor chip 6 will be mounted, and a plurality of lands 4 arranged in a lattice on another face side.

The connection pads 3 and their corresponding lands 4 are electrically connected via wires and the like. The lands 4 are disposed such that bumps 5 made from, for example, solder balls can be formed at predetermined locations when forming the boards. This obtains a wiring motherboard M1. The wiring motherboard M1 is then shifted to a die-bonding step.

Figure 10A:
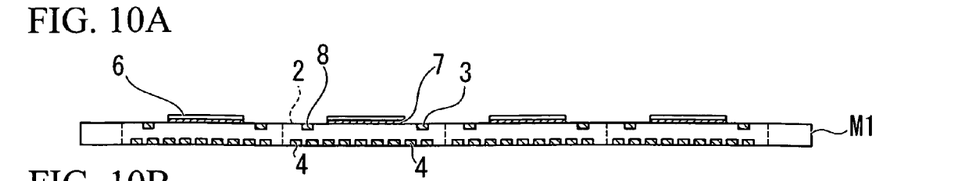
FIGS. 10A-10G are step diagrams of steps of manufacturing a semiconductor device in a first example.

As shown in FIG. 10A, a semiconductor chip 6 is mounted in a central region of each product-formation region on the wiring motherboard M1. A die-bonding device (not shown) secures the semiconductor chips 6 in the product-formation regions through, for example, an insulating adhesive DAF 7 (die-attach film).

Figure 10B:
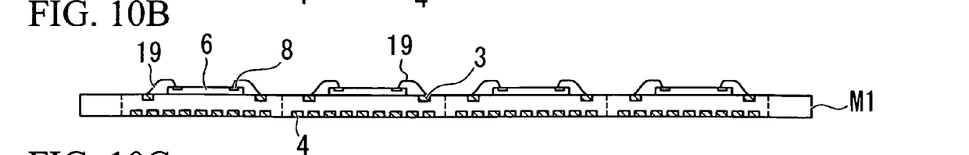

Subsequently, shifting to a wire-bonding step, as shown in FIG. 10B, the electrode pads 8 on the semiconductor chips 6 and corresponding connection pads 3 on the wiring motherboard M1 (wiring boards 2) are joined by conductive wires 19 of, for example, Au. A wire-bonding device (not shown) thermosonically bonds the electrode pads 8 to the wires, which have been melted and have balls formed at their tips, and then thermosonically bonds the rear ends of the wires to the connection pads 3 on the wiring board, while drawing the wires in a predetermined loop shape. Al the electrode pads 8 and the connection pads 3 are joined by the wires 19.

The wiring motherboard that has completed die-bonding and wire-bonding is then shifted to a sealing (molding) step. In a general molding step, the wiring motherboard is clamped between a top-part sealing die 18 of a transfer molding device (not shown) and a bottom-part sealing die 19 (not shown), and this is filled with molten resin, e.g. thermosetting epoxy resin or the like. Curing is performed in this filled state to thermally harden the resin, thereby forming the primary sealant 10 that collectively covers the plurality of product-formation regions shown in FIG. 10C. Using mold array, the primary sealant 10 is formed more efficiently, and the sequence then proceeds to a ball-mounting step of FIG. 10F.

Figure 10C:
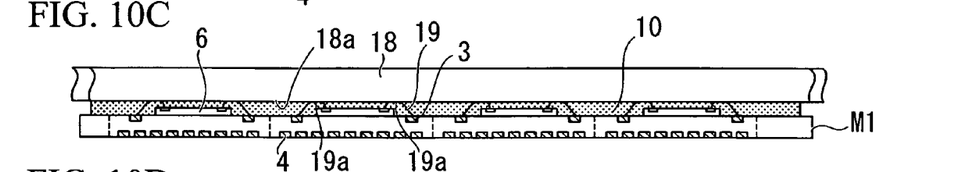

In this embodiment, as a molding first stage, as shown in FIG. 10C, the top-part sealing die 18 is set at a position where it touches the tip parts of the wires 19, where the interval from the chip top edge is approximately 0.08 mm, and, with the wiring motherboard M1 clamped between the top-part sealing die 18 and a bottom-part sealing die (not shown), sealing resin is filled therein, and cured to form the primary sealant 10. After sealing, the top-part sealing die 18 is released and raised.

Figure 10D:
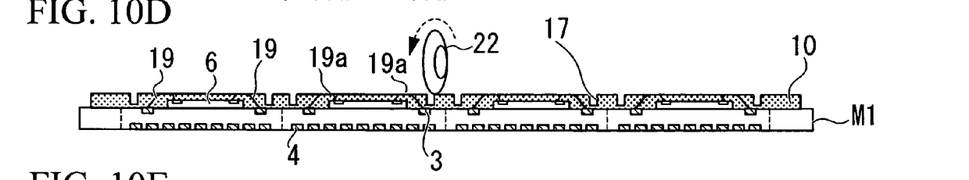
Figure 13:
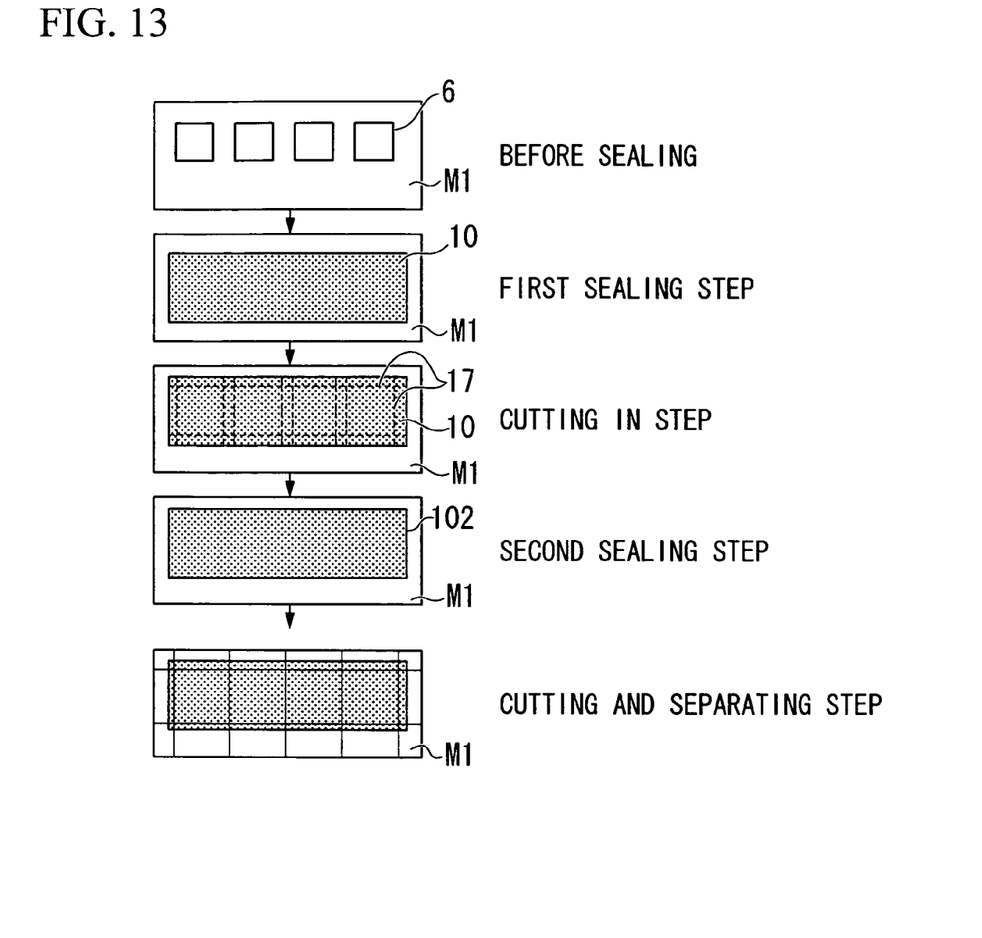
FIG. 13 is a step diagram of a step of forming indentations, in a manufacturing step of the semiconductor device in the first example.

To increase adhesion between the primary sealant and the secondary sealant, a plasma-cleaning device (not shown) plasma-cleans the surface of the primary sealant. Moreover, to prevent interface peeling of the secondary sealant and increase adhesion with the primary sealant 10, as shown in FIG. 10D, a dicing blade 22 can be used to provide indentations 17 in the primary sealant 10. As shown in FIG. 13, the indentations 17 are provided further inside than the positions where the wiring motherboard M1 is cut into individual semiconductor devices, and at positions that do not affect the wires 19 or the semiconductor chip 6.

Figure 10E:
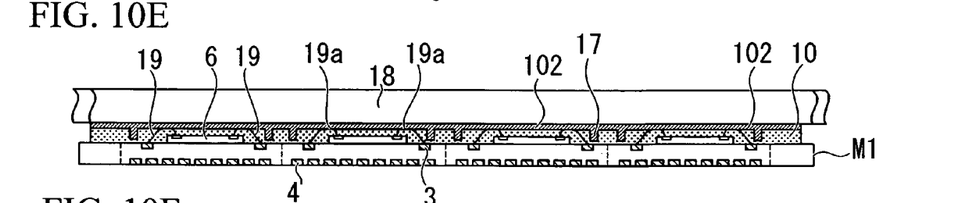

Subsequently, as a molding second stage, as shown in FIG. 10E, the top-part sealing die 18 is raised slightly from the first stage so that there is an interval of approximately 0.15 mm between the sealing resin and the top face of the semiconductor chip 6, and, with the wiring motherboard M1 clamped between the top-part sealing die 18 and the top-part sealing die 19 (not shown), it is filled with sealing resin and cured to obtain a thin secondary seal formed by the secondary sealant 102.

Figure 10F:
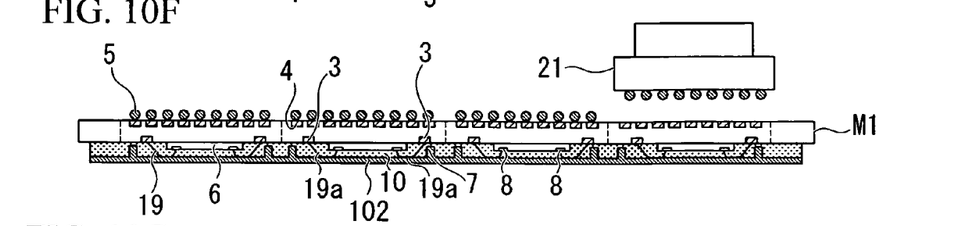

After the primary sealant 10 and the secondary sealant 102 have been formed, the wiring motherboard M1 is shifted to a ball-mounting step. In the ball-mounting step, as shown in FIG. 10F, solder balls 5 are mounted on the lands 4 on the other face of the wiring motherboard M1 to form external terminals. The ball-mounting step is executed by, for example, using the mount tool 21 of a ball mounter to subject the solder balls 5 to vacuum suction, and mounting them on the lands 4 of the wiring motherboard M1 (wiring boards) through a flux. The wiring motherboard M1 is then reflowed, and the solder balls 5 are connected onto the lands 4 to form bumps.

Figure 10G:
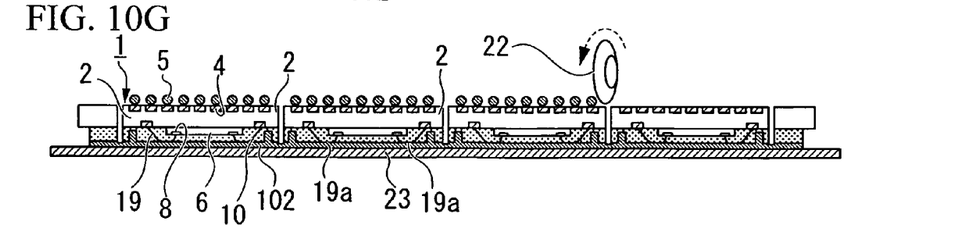

Subsequently, the wiring motherboard M1 is shifted to a board-dicing step. In the board-dicing step, as shown in FIG. 10G, the secondary sealant 102 is glued to a dicing tape 23, and a high-rotation dicing blade 22 performs rotary-grinding along the dicing lines of the wiring motherboard M1 to cut away and separate the individual product-formation regions. These are then picked up from the dicing tape 23 to obtain the semiconductor devices 1.

SECOND EXAMPLE

Using FIGS. 11A to 11F, a method of manufacturing the semiconductor device in a second example will be explained. The second example corresponds to the method of manufacturing the semiconductor device of the second embodiment.

Figure 11A:
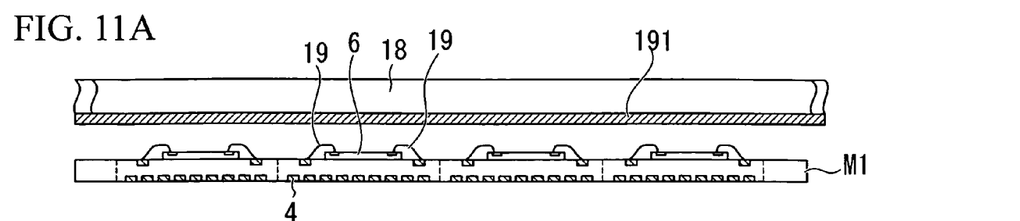
FIGS. 11A-11F are step diagrams of steps of manufacturing a semiconductor device in a second example.

After executing a die-bonding step and a wire-bonding step as in the first example, the method shifts to a molding step. As shown in FIG. 11A, after setting a thick releasing film 191 on the top-part sealing die 18, the top-part sealing die 18 is pressed down until the releasing film 191 touches the tip parts of the bonding wires 19, and set at an interval of 0.08 mm between the releasing film bottom edge and the chip top edge. The wiring motherboard is then clamped by a bottom-part sealing die (not shown), and the wires are collectively flattened to provide flat parts 19a (FIG. 11B).

Figure 11B:
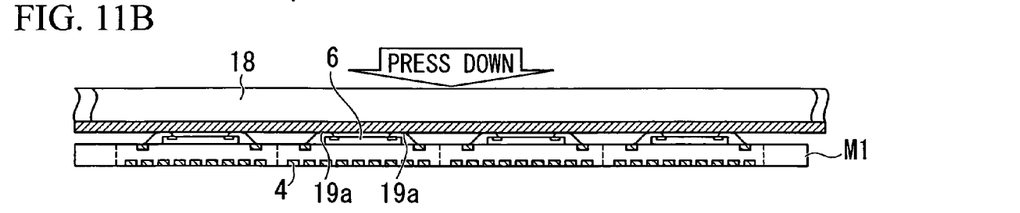
Figure 11C:
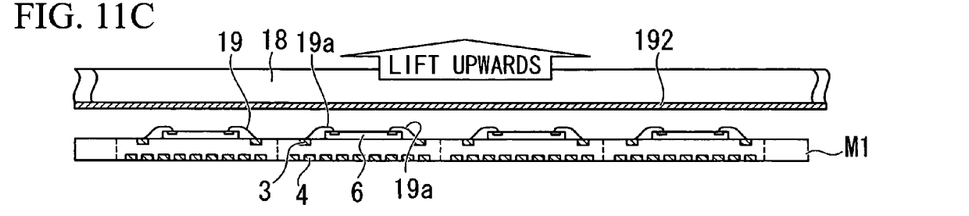

Subsequently, without performing resin sealing, the top-part sealing die 18 and a thick releasing film 192 are temporarily lifted upwards, e.g. to their original positions, and the thick releasing film 192 is replaced with a thin releasing film 192 (FIG. 11C).

Figure 11D:
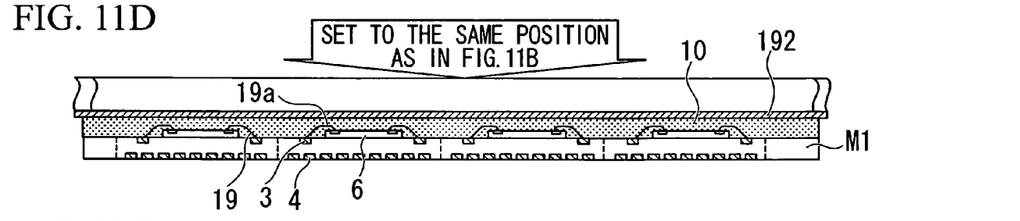

With the thin releasing film 192 in a set state, the top-part sealing die 18 is pressed down to the same position as in FIG. 11B, the wiring motherboard is clamped by the bottom-part sealing die (not shown), filled with sealing resin, and cured to form the primary sealant 10 (FIG. 11D).

Figure 11E:
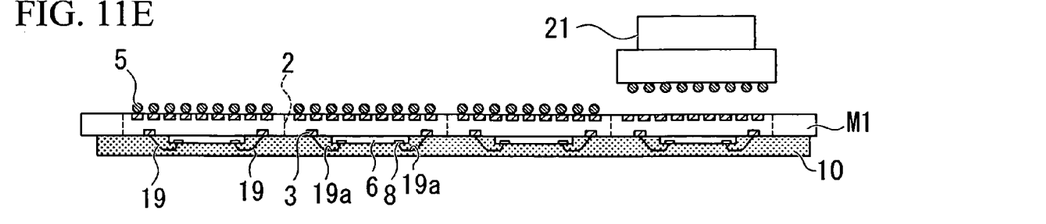
Figure 11F:
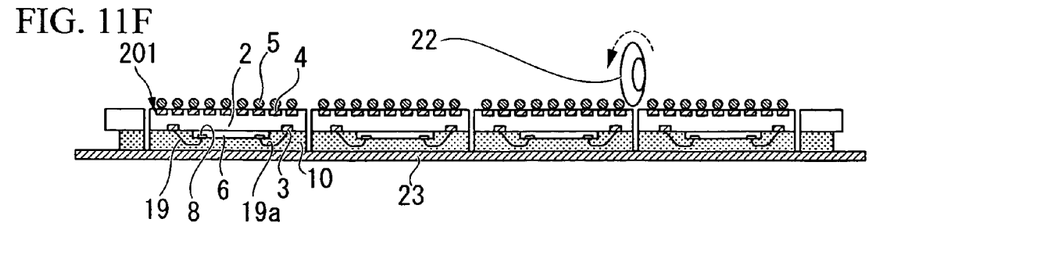

In the stage where the top and bottom sealing dies are released and the molding step ends, the releasing film 192 is removed from the sealant portion. The wiring motherboard with the sealant formed therein is shifted to a ball-mounting step, and the same step as in the first example are executed (FIGS. 11E and 11F). Thus the semiconductor device is obtained.

THIRD EXAMPLE

Using FIGS. 12A to 12E, a method of manufacturing the semiconductor device in the third example will be explained. The third example corresponds to the method of manufacturing the semiconductor device of the third embodiment.

Firstly, after executing a die-bonding step and a wire-bonding step as in the first example, the method shifts to a molding step.

Figure 12A:
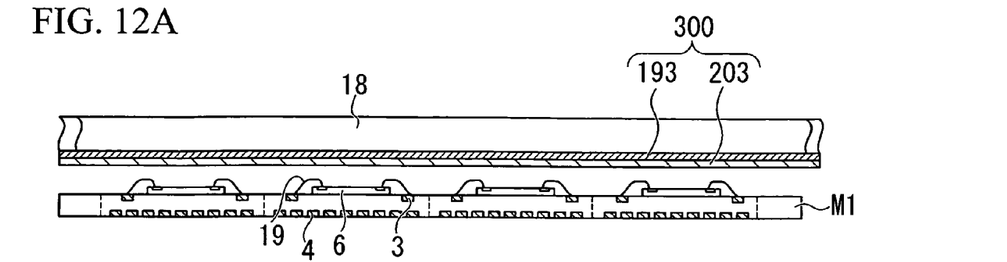
FIGS. 12A-12E are step diagrams of steps of manufacturing a semiconductor device in a third example.
Figure 12B:
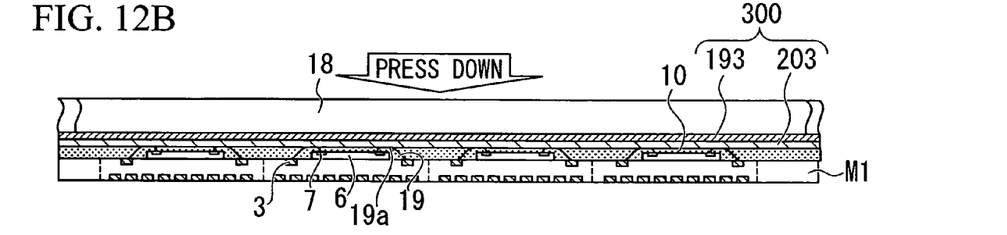

In this example, as shown in FIG. 12A, after setting a two-layer film 300 including a releasing film 193 and an insulating film 203 on the top-part sealing die 18, the top-part sealing die 18 is pressed down and set at a position that the two-layer film 300 touches the tip parts of the bonding wires 19. The interval from the chip top edge to the two-layer film bottom edge is approximately 0.08 mm. The wiring motherboard is then clamped by a bottom-part sealing die (not shown), filled with sealing resin, and cured to form the primary sealant 10 (FIG. 12B).

Figure 12C:
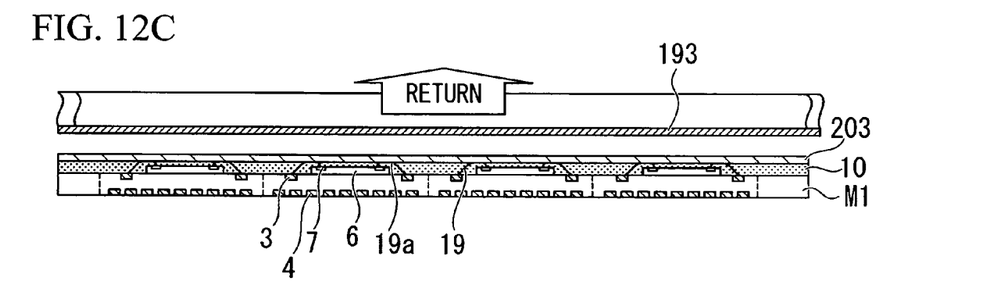
Figure 12D:
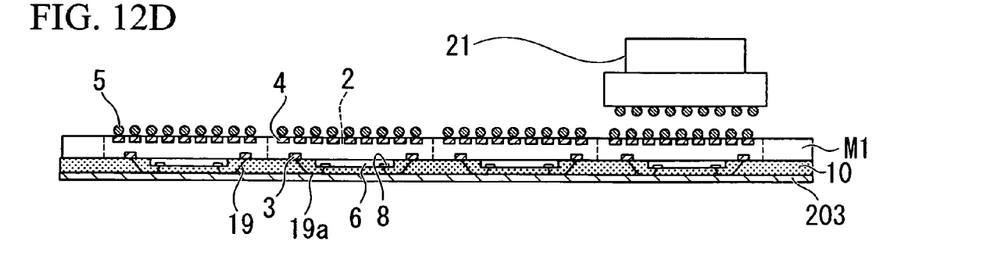
Figure 12E:
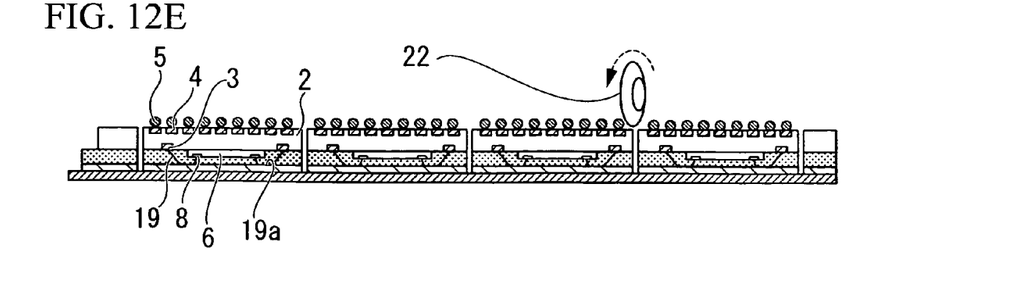

Subsequently, when releasing the top-part sealing die 18, only the releasing film 193 of the two-layer film 300 is peeled away at the same time lifting as the top-part sealing die 18, leaving the insulating film 203 stuck to the primary sealant 10 (FIG. 12C). The wiring motherboard with the primary sealant 10 and the insulating film 203 formed on it is then shifted to a ball-mounting step, and the same step as in the first example are thereafter performed (FIGS. 12D and 12E). This obtains the semiconductor device.

The present invention can suppress variation in the height of the wires by abutting a sealing die against them, thereby suppressing increase in defective products and deterioration in product lifespan, in addition to achieving a thinner package which can be designed with resin of minimum thickness.

It is apparent that the present invention is not limited to the above embodiments, but may be modified and changed without departing from the scope and spirit of the invention.

What is claimed is:

1. A semiconductor device comprising:
   a wiring board;
   a semiconductor chip that is disposed on one face side of the wiring board; and
   wires that form loop shapes from electrode pads of the semiconductor chip between the electrode pads on a main surface of the semiconductor chip and connection pads on the wiring board,
   wherein the wires comprise flat parts that are buried by a sealing material,
   wherein the sealing material comprises a primary sealant and a secondary sealant, and
   the flat parts are at an interface between the primary sealant and the secondary sealant.

2. The semiconductor device according to claim 1, wherein the primary sealant comprises one or more indentations that are filled with the secondary sealant.

3. A semiconductor device comprising:
   a wiring board including a first surface and a plurality of connection pads formed on the first surface;
   a semiconductor chip including an upper surface and a plurality of electrode pads formed on the upper surface, and mounted on the first surface of the wiring board;
   a plurality of bonding wires electrically connecting the connection pads of the wiring board to the electrode pads of the semiconductor chip, respectively, each of the bonding wires including a flat part that is substantially parallel to the upper surface of semiconductor chip, and the flat part of selected one of the bonding wires is disposed substantially coplanar with the flat part of another of bonding wires;
   a first resin layer provided between the upper surface of the semiconductor chip and the flat part of the selected one of the bonding wires; and
   a second resin layer provided on the first resin layer, at least a part of the flat part of the selected one of the bonding wires being disposed between the upper surface and the second resin layer.

4. The semiconductor device according to claim 3, wherein the first resin layer includes one or more indentations that are filled with the second resin layer.

5. The semiconductor device according to claim 3, wherein the plurality of electrode pacts are disposed on a position that is a periphery of the upper surface of the semiconductor chip.

6. The semiconductor device according to claim 3, wherein the first resin layer and the second resin layer are same material.

7. The semiconductor device according to claim 3, wherein the first resin layer and the second resin layer are a thermosetting resin.

8. The semiconductor device according to claim 3, wherein the semiconductor chip includes a lower surface opposed to the upper surface, and the semiconductor chip mounted on the first surface of the wiring board so that the lower surface of the semiconductor chip faces the wiring board.

9. The semiconductor device according to claim 3, wherein the first resin layer includes one or more indentations that are filled with the second resin layer.

10. The semiconductor device according to claim 3, wherein the plurality of electrode pads are disposed on a position that is a periphery of the upper surface of the semiconductor chip.

11. The semiconductor device according to claim 3; Wherein the first resin layer is extended from the flat part of selected one of the bonding wires to the flat part of another of the bonding wires.

12. The semiconductor device according to claim 3, wherein at least a part of the selected one of the bonding wires are disposed between the upper surface and the second resin layer.

13. The semiconductor device according to claim 3, wherein the semiconductor chip includes a lower surface opposed to the upper surface, and the semiconductor chip mounted on the first surface of wiring board so that the lower surface of the semiconductor chip faces the wiring board.

14. A semiconductor device comprising:
   a wiring board including a first surface and a plurality of connection pads provided on the first surface;
   a semiconductor chip including an upper surface and a plurality of electrode pads provided on the upper surface, and mounted over the first surface of the wiring board;
   a plurality of bonding wires electrically coupling the connection pads to the electrode pads, respectively, each of the plurality of bonding wires including a flat part, and each of the flat parts substantially parallel to the upper surface of the semiconductor chip;
   a first resin layer provided between the upper surface of the semiconductor chip and the flat parts of the bonding wires; and
   a second resin layer provided on the first resin layer.

15. A semiconductor device comprising:
   a wiring board;
   a semiconductor chip that is disposed on one face side of the wiring board; and
   wires that form loop shapes between electrode pads on a main surface of the semiconductor chip and connection pads on the wiring board, a top surface of the electrode pads being above a top surface of the connection pads,
   wherein the wires comprise flat parts that are buried by a sealing material, wherein the sealing material comprises a primary sealant and a secondary sealant, and the flat parts are at an interface between the primary sealant and the secondary sealant.

16. The semiconductor device according to claim 15, wherein the wires are formed loop shapes from the electrode pads of the semiconductor chip to the connection pads of the wiring board.

17. The semiconductor device according to claim 15, wherein the primary sealant comprises one or more indentations that are filled with the secondary sealant.

18. The semiconductor device according to claim 15, wherein the primary sealant and the secondary sealant area thermosetting resin.

* * * * *